United States Patent [19]
Powell et al.

[11] Patent Number: 5,157,346
[45] Date of Patent: Oct. 20, 1992

[54] RF WIDEBAND HIGH POWER AMPLIFIER

[75] Inventors: Jack Powell, Cestas, France; Thomas Ha, Gardena, Calif.

[73] Assignee: Motorola, Inc., Schaumburg, Ill.

[21] Appl. No.: 690,930

[22] PCT Filed: Nov. 12, 1990

[86] PCT No.: PCT/EP90/01889
§ 371 Date: Jun. 19, 1991
§ 102(e) Date: Jun. 19, 1991

[87] PCT Pub. No.: WO91/07817
PCT Pub. Date: May 30, 1991

[30] Foreign Application Priority Data
Nov. 16, 1989 [GB] United Kingdom ............... 8925961

[51] Int. Cl.⁵ ............................................. H03F 1/32
[52] U.S. Cl. .................................. 330/151; 330/107; 330/149
[58] Field of Search ............... 330/107, 109, 149, 151, 330/284; 307/350, 511

[56] References Cited
U.S. PATENT DOCUMENTS
4,916,407 4/1990 Olver .................................. 330/151

Primary Examiner—Steven Mottola
Attorney, Agent, or Firm—Bradley J. Botsch

[57] ABSTRACT

A r.f. wideband high power amplifier (1) receives an input signal at its input via a coupler (7) whenever a signal for amplification is applied to an input port (15). The output of the amplifier (1) is tapped by a coupler (8) and fed to an input of a comparator (3). The input signal applied at the input port (15) is fed to a second input of the comparator (3) via a delay line (5), arranged to introduce a delay substantially equal to that of the power amplifier (1). The comparator (3) produces at its output an error signal representative of the difference between the input signal fed via the amplified and the delayed path. A combiner (16) serves to introduce the amplified error signal to the amplifier output signal such that the error signal is in anti-phase therewith. Thus, the resultant signal produced at an output port (4) has had feed forward distortion cancellation. In accordance with the present invention the arrangement further includes an amplitude compensating network (8) in the form of a PIN-diode attenuator, controlled by a signal from a comparator (14). The comparator (14) provides a control signal to the attenuator (8) in accordance with the respective levels of signal from a first detector (17) and a second detector (18). The feedback control loops are arranged to function with a fast response time with respect to the period of the highest frequency of the input signal.

4 Claims, 4 Drawing Sheets

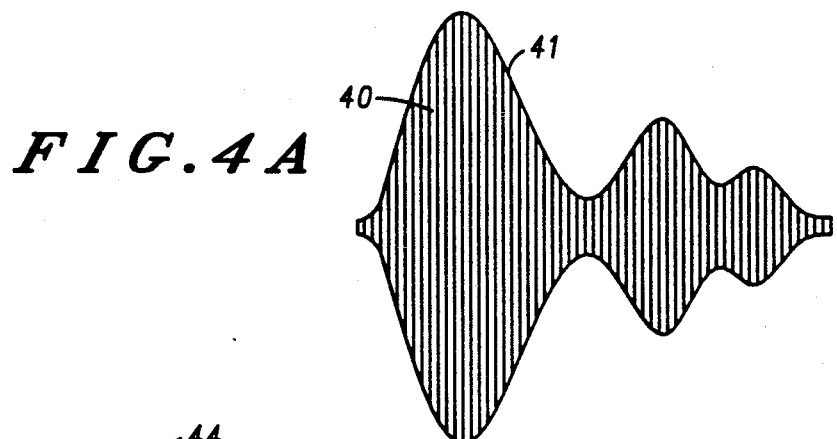
FIG.4A
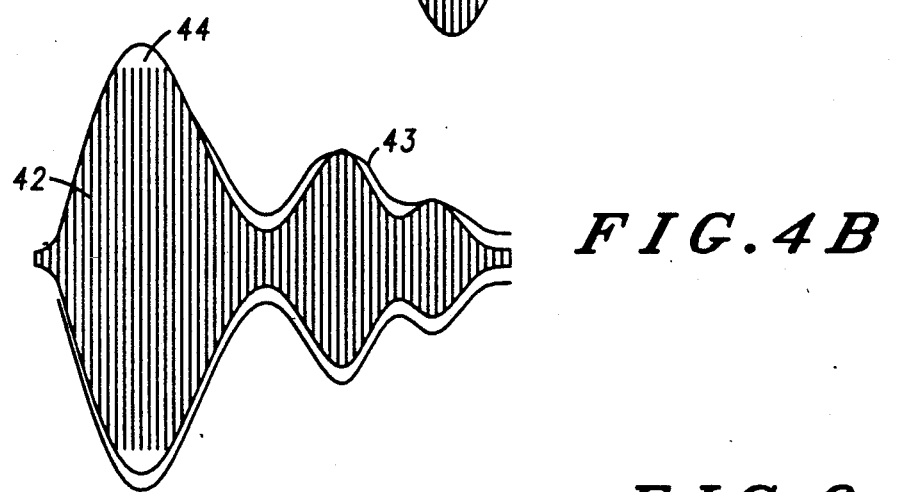
FIG.4B
FIG.6
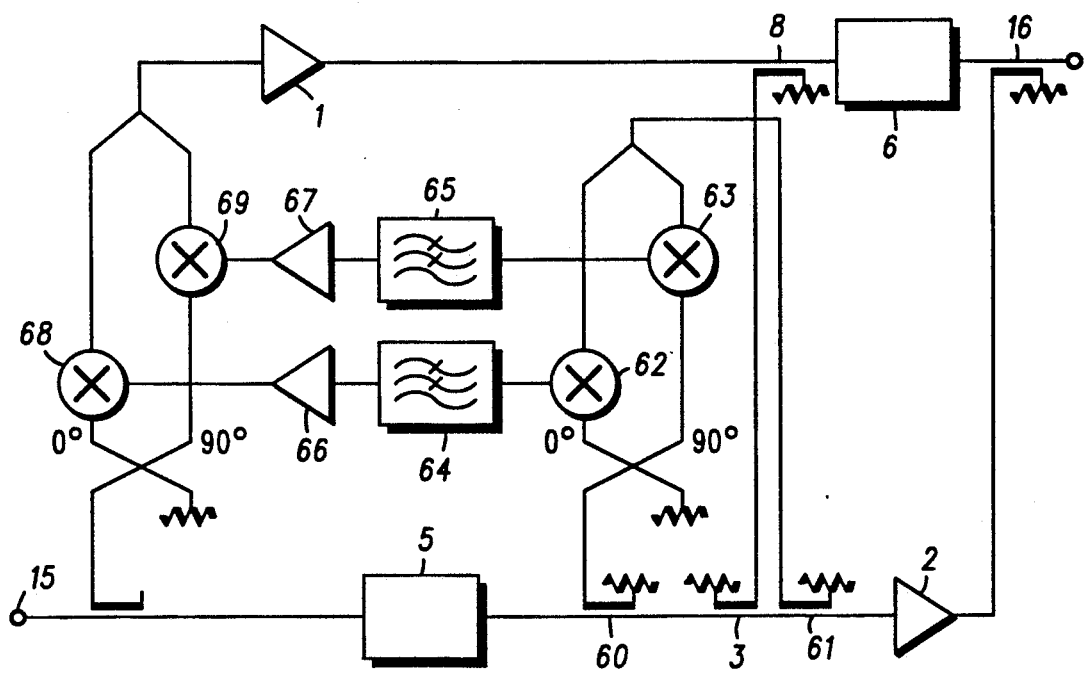

RF WIDEBAND HIGH POWER AMPLIFIER

The present invention relates to amplifiers and in particular to high power amplifiers wherein feed forward cancellation is employed, such as those used in wide band radio-frequency (r.f.) applications.

In amplifier design, there is a trade off to be made between distortion performance and efficiency. Amplifiers which operate under so-called 'Class A' conditions have good distortion but low efficiency whereas an amplifier operated under class C conditions is reasonably efficient but introduces significant distortion. High efficiency and low distortion is the goal, but efficiency increasingly becomes a consideration at high power levels. For example, a typical cellular radio multi-carrier base station amplifier requirement would be 200 w average, 2 kw peak so clearly efficiency must be the best achievable if undue heat dissipation in the amplifier is to be avoided. Unfortunately, the common technique of negative feedback, as used in fixed frequency intermediate frequency amplifiers for example, to correct distortion can only be considered for narrow band applications in r.f. high power amplifiers. For this reason, many r.f. power amplifiers operate in class A with the consequent heat dissipation tolerated.

As an alternative to class A operation, a more efficient class AB amplifier may be employed if feed-forward cancellation is applied. In this technique, the amplifier output (suitably scaled) is compared with the input signal in a first comparison loop to yield an error signal. The error signal is amplified and reintroduced to the output 180° out of phase with the original distortion in a second correction loop, the distortion products being thereby cancelled in the final output. Feed forward can yield a 30 dB improvement in distortion performance but only if both the first comparison loop and the second correcting loop are accurately aligned. Generally the loop parameters do no remain constant over the full operating range of the amplifier and some dynamic correction is required, particularly in wideband applications. For example, the error signal may be subject to amplitude and phase control prior to amplification. To provide the required control signals, a pilot tone may be injected into the amplifier input. The pilot signal (at residual distortion level) is detected at the output and used to provide control signals.

For an account of such a correction technique reference may be made to the applicants co-pending application Ser. No. 07/690,929, now U.S. Pat. No. 5,155,448.

In considering the first comparison loop, the objective is that only distortion power is present at the input of the error amplifier, that is to say that the signals due to the input at the point of comparison must cancel. Thus the path via the amplifier to the comparator must balance the undistorted reference path to the comparator. To ensure that this condition is met, amplitude and phase networks may be introduced into the amplifier path. In some arrangements, feed back control of the networks is employed, the control voltages being derived either from comparator output (i.e. distortion power) or separate phase and amplitude comparisons of the signals reaching the feed forward loop comparator, with the objective of maintaining balance. The control becomes active when imbalance occurs for example due to amplifier drift with temperature or if amplifier characteristics are sensitive to average power input. essentially slowly varying parameters are balanced, a typical response time being of the order of 1 mS. Typically even a low bandwidth amplifier has a signal bandwidth of 1MHz, which is a period of 1 μS. Hence control loop response is relatively very slow compared with signal bandwidth. Indeed, low pass filtering of control signals or even use of temperature detectors to give average power feedback is used.

It is an objective of the present invention to provide a feed forward amplifier with improved comparison loop correction compared with the prior art techniques described above.

According to the present invention an amplifier arrangement for amplifying a signal having a substantially known signal bandwidth, to which feed forward cancellation is applied by a comparison loop having comparison means for comparing the output of the amplifier with a delayed input signal to provide an error signal, a cancellation loop including secondary amplifier means for amplifying the error signal, and combining means for combining said amplified error signal with said amplifier output, said amplifier arrangement further includes a compensating network in the amplifier loop, a first detector coupled to said amplifier output to derive a parameter thereof, a second detector coupled to said delayed input signal to derive a thereof.

means for comparing the respective outputs of said detectors to derive a control signal which is applied to said compensating network, the response time of said control being less than the period of the highest frequency of said signal bandwidth Preferably a plurality of compensating networks, each controlled by a signal derived from a different parameter are included, for example parameters derived from the amplitude and phase of said amplifier output. Advantageously, a parameter may be derived from the envelope of said amplifier output.

For preference, the response time is at least equal to the highest frequency of said signal bandwidth.

In order that features and advantages of the present invention may be further appreciated, an embodiment will now be described, by way of example only, with reference to the accompanying diagrammatic drawings, of which:

FIG. 4a, and 4b are time domain representations of a signal and distortion.

Figure 5:
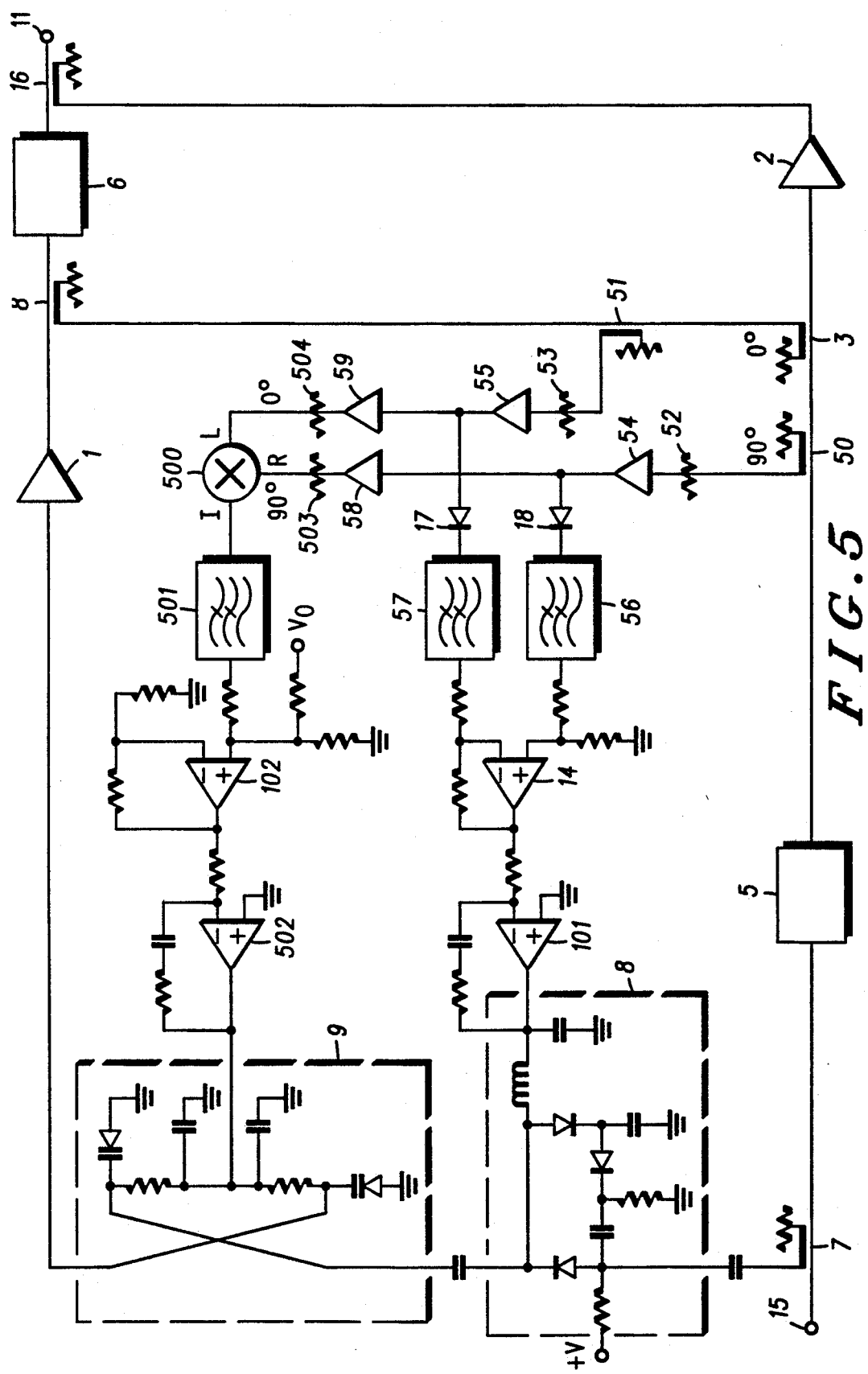

FIG. 5 represents in some detail an embodiment of the present invention based on polar feedback and FIG. 6 represents in some detail an embodiment of the present invention based on cartesian feedback.

An r.f. wideband high power amplifier 1 (FIG. 1) receives an input signal at its input via a coupling 7 whenever a signal for amplification is applied to input port 15. The output of the amplifier 1 is tapped by a coupler 8 and fed to an input of a comparator 3, which may take the form of another directional coupler. The input signal applied at port 15 is fed to a second input of comparator 3 via a delay line 5, arranged to introduce a delay substantially equal to that of the power amplifier 1. Comparator 3 thus produces at its output an error signal representative of the difference between the input signal fed via the amplified and the delayed path. The amplified and the delayed paths constitute the comparison loop of a feed forward arrangement. If the comparison loop is balanced, the error signal produced at the output of the comparator 3 is representative of distortion introduced by the power amplifier 10 and is fed via amplitude and phase matching networks 10,11 to an error amplifier 2 and thence to an input of a combiner 16, which may take the form of a directional coupler.

A second input of combiner 16 receives the output signal of the power amplifier 1 via a delay line 6 arranged to introduce a delay substantially equal to that introduced by comparator 3, matching networks 10 and 11 and error amplifier 2. Delay lines 5 and 6 may for example take the form of a length of coaxial cable transmission line. Combiner 16 serves to introduce the amplified error signal to the amplifier output signal such that the error signal is in anti-phase therewith. The resultant signal produced at output port 4 thus has had feed forward distortion cancellation applied; the delayed path via network 6 and the error signal path via amplifier 2 constituting the cancellation loop of the feed forward arrangement.

The embodiment as described thus far is essentially a known form of feed forward arrangement and such an arrangement may be configured typically to yield about a 30 dB improvement in distortion performance compared with an uncorrected amplifier. In accordance with the present invention, however, the arrangement further includes an amplitude compensating network 8 in the form of a PIN-diode attenuator, controlled by a signal from a comparator 14. Comparator 14 provides a control signal to the attenuator 8 in accordance with the respective levels of signal from a first detector 17 and a second detector 18. First detector 17 is an envelope detector for extracting the envelope level of the amplified input signal which when compared with the level of the delayed input signal extracted by a second envelope detector 18 coupled to the output of the delay network 5, yields a control signal representative of amplitude distortion introduced by power amplifier 1. In an analogous way, a second compensating network 9 receives a control signal from a phase sensitive detector 12, being derived from the outputs of detectors 19 and 100. This signal is representative of the phase distortion. Gain is provided in the amplitude and phase loops by amplifiers 101, 102 respectively.

The operation of the embodiment described above will now to be considered in more detail.

Figure 2A:
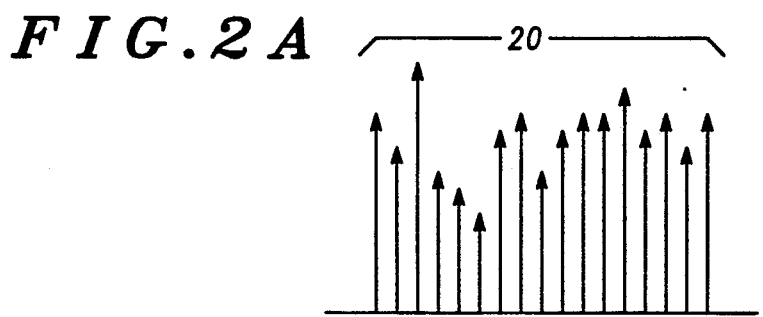
FIGS. 2a, 2b, and 2c are spectral representations of a signal and distortion.
Figure 2B:
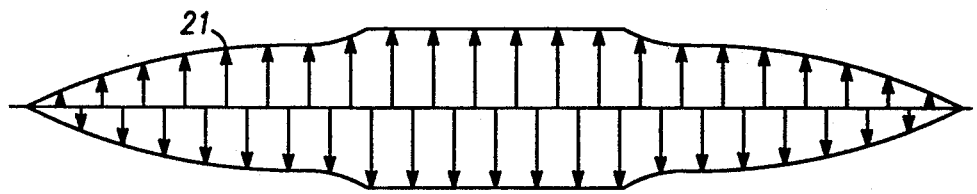

A signal applied to input 15 of the amplifier arrangement may have a spectrum 20 FIG. 2(a) and such a spectrum will be present at the input of comparator 3 which is received via delay network 5. The spectrum of the signal at the output of the power amplifier 1 will include distortions products (FIG. 2(b)) 21 introduced by amplification, to yield a spectrum 22 (FIG. 2(b)) at the comparator input, which includes a portion 23 covering the signal bandwidth, and portions 24 and 25 outside this bandwidth.

Figure 3:
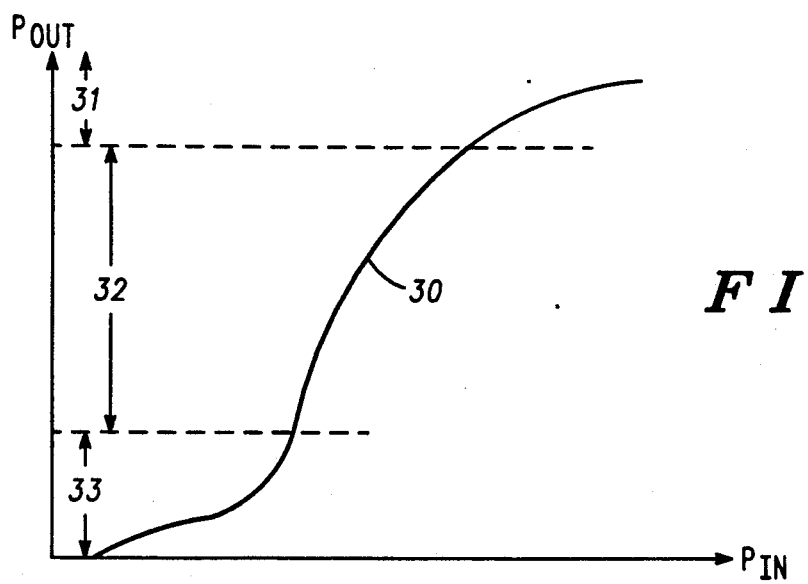
FIG. 3 is a main amplifier transfer function.

Amplifier 1 (FIG. 1) will have a transfer function of the type exemplified by characteristic 30 (FIG. 3), comprising a relatively linear region 32, and two relatively non-linear regions 31 and 33.

A signal 40 (FIG. 4) having an envelope 41 applied at the input 15 of the feed forward arrangement might appear as an output signal 42 (FIG. 4 (b)) having an envelope 43. It will be noted that the signal has been distorted, due to the non-linearities in the amplifier transfer function. In the prior art, this latter problem has been tackled by providing controlled amplitude and phase networks in the amplifier leg of the comparison loop as described above. The control was achieved by providing control loops relatively slow compared with the period of the signal components; distortions caused by the intrinsic performance of the amplifier, such as the compression being left to the feed forward correction arrangement itself.

Amplitude and phase imbalances occurring as a result of transient conditions remain uncorrected by prior art techniques. For example, suppose an r.f. communications feed forward amplifier were operating with half its total possible number of carriers present and that the full number of carriers appears suddenly. Since the amplitude and phase characteristics of the amplifier are power level dependent, distortions will occur due to loop imbalance during the build up. These are uncorrected by prior art feedback control unit their comparatively long response time has passed. This distortion has placed a limit on the peak handling power of the amplifier.

It will be appreciated that the present invention provides a significant departure from the prior art in that amplitude and phase control is applied with a response time of the order of the period of signal components which enables not only the loop to be balanced in transient conditions but also the distortion products introduced to be corrected, at least in part. This produces the important result that either the peak power handling of the amplifier is improved or the power rating of both the main and error amplifiers may be reduced for the same performance. This will now be considered in more detail.

Figure 2C:
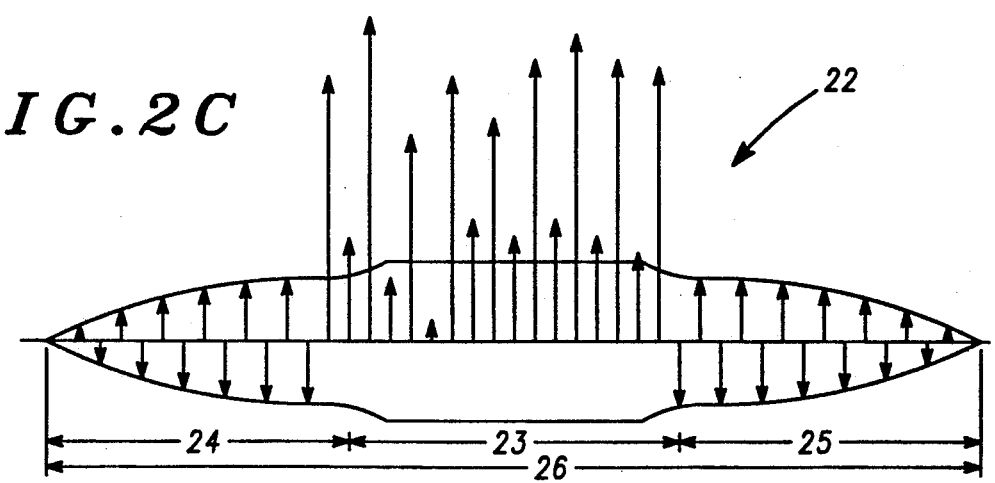

A signal which enters the non-linear region 31 (FIG. 3) of the amplifier will be subject to compression (at 44 (FIG. 4 (b), for example). Such compression gives rise to distortion products across a bandwidth including the signal bandwidth, (FIG. 2 (c)), which in prior art arrangements gives (in band limited form) the error signal subject to feed forward cancellation.

In the present embodiment, however, detectors 17 and 18 and their associated control loops have fast response times to keep the comparison loop in balance during at least part of the compression region. By these means, the level of the distortion products giving rise to the feed forward error signal is reduced, giving an overall improvement in the performance of the amplifier arrangement.

For arrangements including the present invention prior art comparison loop correction may still be valid and may be incorporated by providing such slow response in addition to the fast response loops of the present invention.

Figure 1:
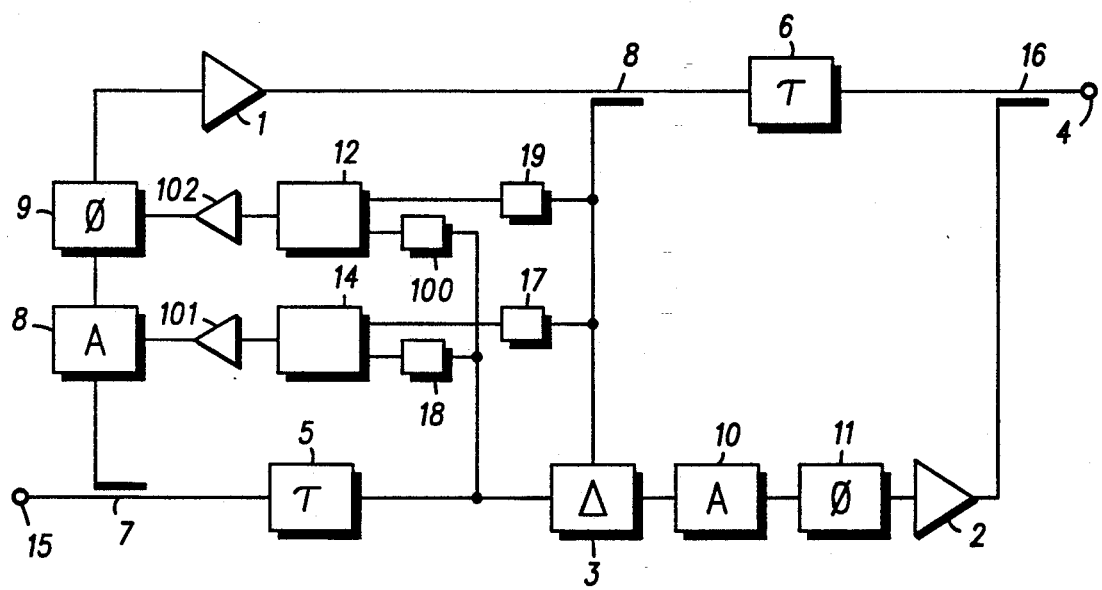
FIG. 1, represents an amplifier having feed forward cancellation in accordance with the present invention.

In one preferred form of the present invention (FIG. 5) reference numerals common with those of FIG. 1 have been used for items of the same functionality. Envelope detector diodes 17, 18 are fed respectively with the signals passing along the two limbs of the comparison loop via sampling couplers 50 and 51, r.f. pads 52, 53 and r.f. gain stages 54, 55. The detectors are such that they respond to the envelope of the received signals, filters 57 and 56 being low pass but at least passing frequency components of the envelope. Comparator 14 serves to derive a control signal passed to amplitude network 8 via amplifier 101, which in particular is a fast operational amplifier to provide the response in accordance with the present invention. In the arrangement as shown the delay of amplifier 1 in responsdingto events at input 15 might typically be of the order of 50 nS. The operational amplifiers in the control loop would have a response time of the order of 100 nS and the pin diodes in the amplitude network a response time of 100 nS. Thus typically the overall response time of the control loop would be between 200 and 250 ns.

The sampled signals at the outputs of amplifiers 54 and 55 are fed to the inputs of a mixer 500 via further gain stages 58, 59 and r.f. pads 503 and 504, such that the mixer 500 receives a 0 degree reference at its local oscillator input (L) and a 90 degree signal at its r.f. input (R) to yield a control signal at its intermediate output (I).

It will be appreciated that modulator 500 thus serves as both detector and comparator for the phase control feedback loop. The output signal from the modulator I output is conditioned by a filter 501 and a gainstage 102 before filtering 502 to drive the phase network 9. Amplifier 102 is a fast response operational amplifier, to which an offset voltage VO may be applied to compensate for any DC offset in modulator 500. The response time of this latter loop would typically be between 300 and 350 nS. Such a response time implies that the comparison loop will remain balanced for events occurring at input 15 over a band width of 3MHz. This is vastly different from the 1 mS response of prior art arrangements (1 kHz bandwidth), and should be compared with the 1MHz signal bandwidth of some mobile radio installations.

In a yet further preferred embodiment of the present invention (FIG. 6, in which common reference numerals have again been used) a cartesian feedback arrangement based on I,Q demodulators 62, 63 and IQ modulators 68,69 is employed. The demodulators are fed with the reference signal provided from a sampling coupler 60 either at 0 degrees (I,Q demodulator 62) or at 90 degrees (I,Q demodulator 63) so that demodulation occurs with respect to the distortion signal provided by a sampling coupler 61. Signal conditioning filters and amplifiers (64, 65, 66 and 67) provide control signals for I,W modulators 68 and 69. It will be appreciated that since the present embodiments is based upon modulators, the response time may be extremely fast, likely to be limited by the performance of amplifier stages 66 and 67 and filters 64 and 65.

It will be appreciated that a feed forward wideband amplifier arrangement in accordance with the present invention may itself serve as a main amplifier in further feed forward loops.

What is claimed is

1. An amplifier arrangement for amplifying a signal having a substantially known signal bandwidth, to which feed forward cancellation is applied by a comparison loop having a comparison means for comparing the output of the amplifier with a delayed input signal to provide an error signal, a cancellation loop including secondary amplifier means for amplifying the error signal with said amplifier output, said amplifier arrangement further includes an amplifier compensating network (8) in the amplifier loop, a first detector (17) coupled to said amplifier output to derive a parameter thereof, a second detector (18) coupled to said delayed input signal to derive a parameter thereof, first means (14) for comparing the respective outputs of said first and second detectors to derive a first control signal which is applied to said amplifier compensating network, an phase compensating network (9) in the amplifier loop, a third detector (19) coupled to said amplifier output to derive a parameter thereof, a fourth detector (100) coupled to said delayed input signal to derive a parameter thereof, second means (12) for comparing the respective outputs of said third and fourth detectors to derive a second control signal which is applied to said phase compensating network, the response time of said first and second control signals being less than or equal to the period of the highest frequency of said signal bandwidth.

2. A wide band amplifier arrangement as claimed in claim 1 and wherein a parameter is derived from the amplitude of said amplifier output.

3. A wide band amplifier arrangement as claimed in claim 1, and wherein a parameter is derived from the phase of said amplifier output.

4. A wide band amplifier arrangement as claimed in claim 1 wherein a parameter is derived from the envelope of said amplifier output.

* * * * *